United States Patent

Suzuki et al.

[11] Patent Number: 5,287,620
[45] Date of Patent: Feb. 22, 1994

[54] PROCESS OF PRODUCING MULTIPLE-LAYER GLASS-CERAMIC CIRCUIT BOARD

[75] Inventors: Hitoshi Suzuki; Wataru Yamagishi; Koichi Niwa; Kaoru Hashimoto; Nobuo Kamehara, all of Kawasaki, Japan

[73] Assignee: Fujitsu Limited, Kawasaki, Japan

[21] Appl. No.: 894,984

[22] Filed: Jun. 8, 1992

[30] Foreign Application Priority Data

Jun. 18, 1991 [JP]  Japan ................... 3-146136

[51] Int. Cl.$^5$ ................................. H01K 3/10
[52] U.S. Cl. .......................... 29/852; 427/97
[58] Field of Search ................ 29/852; 427/97

[56] References Cited

U.S. PATENT DOCUMENTS 4,599,277  7/1986  Brownlow et al. ............. 428/552

FOREIGN PATENT DOCUMENTS

| | | |
|---|---|---|
| 0016307 | 10/1980 | European Pat. Off. |
| 0177772 | 4/1986 | European Pat. Off. |
| 0214916 | 3/1987 | European Pat. Off. |
| 0223876 | 6/1987 | European Pat. Off. |
| 0272129 | 6/1988 | European Pat. Off. |
| 61-89839 | 5/1986 | Japan |
| 61-101096 | 5/1986 | Japan |
| 62-133002 | 6/1987 | Japan |
| 63-260199 | 10/1988 | Japan |
| 63-271995 | 11/1988 | Japan |
| 1-201996 | 8/1989 | Japan |
| 1-281795 | 11/1989 | Japan |
| 2-18991 | 1/1990 | Japan |
| 3-212993 | 9/1991 | Japan |
| 88/05959 | 8/1988 | World Int. Prop. O. |

*Primary Examiner*—P. W. Echols
*Attorney, Agent, or Firm*—Staas & Halsey

[57] ABSTRACT

A process of producing a multiple-layer glass-ceramic circuit board having a copper conductor, comprising the steps of: forming throughholes in a glass-ceramic green sheet at sites where via-contacts will be formed; filling the throughholes with a powder mixture of a copper powder blended with a ceramic powder, the copper powder and the ceramic powder having a powder particle size providing a packing density comparable with or greater than that of the glass-ceramic green sheet when filled in the throughholes; printing a conductor paste on the green sheet having the throughholes filled with the powder mixture, to form a circuit conductor pattern on the green sheet; laminating a plurality of the green sheets having the conductor pattern formed thereon, to form a laminate body; heating the laminate body to thereby remove a binder therefrom and preliminary-fire the laminate body; and firing the preliminary-fired body.

7 Claims, 9 Drawing Sheets

→ SUCTION

PROCESS OF PRODUCING MULTIPLE-LAYER GLASS-CERAMIC CIRCUIT BOARD

BACKGROUND OF THE INVENTION

1. Field of the Invention

The present invention relates to a process of producing a multiple-layer glass-ceramic circuit board, more particularly to an improvement in the forming of via-contacts of a multiple-layer glass-ceramic circuit board.

To quickly process a large amount of information, the information processing machines are progressively made smaller in size and larger in processing capacity and LSIs and VLSIS, which are high integrated by miniaturization of electronic elements, are provided for practical use as semiconductor devices occupying the major part of an information processing machine.

These integrated circuits are packaged in such a manner that a plurality of chips of integrated circuits are mounted on a chip-mounting board (interposer) made of ceramic to form an LSI module to be used as a replacement unit mounted on a printed circuit board. Particularly, all of the flip-flop type semiconductor integrated circuits are mounted on a ceramic circuit board.

The ceramic circuit boards on which semiconductor integrated circuits are mounted, are generally used in laminated form, and currently, multiple-layer circuit boards having 20 to 60 laminated layers are provided for practical use. These multiple-layer circuit structures have a via-contact formed of an electroconductive material extending through layers and providing electrical connection between electronic circuits formed in different layers.

Recently, it has been increasingly required that electric signals be transmitted more rapidly between semiconductor devices, and therefore, the circuit conductor be made of a material having a lower electric resistivity and that via-contacts formed in a circuit board be finer to increase the element density of semiconductor devices.

These requirements have led to the development of a glass-ceramic circuit board. To form a circuit conductor of a low resistivity material such as gold, silver, copper or the like, the shrinking temperature during firing of the glass-ceramic board is adjusted to be from 700° to 1000° C. by blending a ceramic with a glass having a softening temperature of 600° to 900° C. To provide high density packaging, the circuit boards have fine via-contacts with a diameter of about 100 μm.

2. Description of the Related Art

A multiple-layer glass-ceramic circuit board is conventionally produced by making a green sheet from a glass-ceramic and an organic binder, forming throughholes in the green sheet at positions at which via-contacts are to be formed, and filling the throughholes with a conductor paste to form via-contacts. A plurality of green sheets composing the respective layers of a multiple-layer circuit board are prepared in the same way.

Each of the thus-prepared green sheets is screen-printed with a conductor paste on the portions including those of the via-contacts or filled throughholes to form an electric circuit pattern, and is then dried.

The dried green sheets are aligned, laminated, and pressed to form an integral laminate body, which is then heated to remove a binder therefrom and fired to provide a multiple-layer glass-ceramic circuit board. The heating for the removal of a binder is carried out at a temperature lower than that at which the subsequent firing is carried out, and is herein referred to as "preliminary firing".

FIG. 1 shows a conventional arrangement for forming via-contacts by using a green sheet 3 having a large number of throughholes or perforations 2 formed therethrough and through a polyethylene terephthalate sheet 1 (commonly called "Mylar sheet") covering the green sheet 3. A suction paper 4 is placed on a filling table 5 provided with an evacuating system (not shown) and the green sheet 3 together with the Mylar sheet 1 placed on the upper surface thereof is overlaid on the suction paper 4.

A conductor paste 15 is placed on the Mylar sheet 1, the evacuating system is actuated, and a squeegee is passed over the Mylar sheet 1 to sweep the conductor paste 15, so that the conductor paste 15 is sucked through the perforations of the Mylar sheet 1 to fill the throughholes 2 of the green sheet 3.

After removing the Mylar sheet 1, the green sheet 3 is screen-printed with a circuit conductor pattern and then dried.

Green sheets 3 corresponding to the respective layers of a multiple-layer circuit board are prepared in the same way, aligned, laminated, and pressed to form an integral laminate body, which is then heated at a relatively lower temperature to effect a preliminary firing and remove a binder from the green sheets 3 and from the conductor paste 15.

The laminate body is then fired at a higher temperature to sinter a glass-ceramic and a conductor metal and form a multiple-layer glass-ceramic circuit board having via-contacts in the laminated layers at the desired positions.

The above-mentioned conventional process uses a conductor paste of a mixture of a conductor metal powder and an organic binder.

The conventional process, however, has the following problems:

(1) Via-contacts frequently contain pores and cracks because of the difference in the shrinkage factors of the conductor metal and the substrate ceramic during sintering thereof because of different sintering behaviors thereof.

(2) Throughholes are difficult to completely fill with the conductor paste because the solvent or binder component of a conductor paste is absorbed by the throughhole wall of a porous green sheet.

(3) When an easily oxidizable metal such as copper is used as the conductor metal, an oxidizing atmosphere cannot be used in the heating for removing a binder, and a reducing atmosphere, such as a humidified atmosphere, must be used instead, under which the removal of a binder is not successful. Accordingly a binder that is not easily thermally decomposed cannot be used in either a conductor paste or a green sheet.

Measures were proposed to solve these problems.

To eliminate the difference between or equalize the shrinking behaviors of the conductor metal and the substrate ceramic, Japanese Unexamined Patent Publication (Kokai) Nos. 61-89839, 62-133002, 63-260199, 63-271995 and 1-201996 proposed the addition of an organic metal to a conductor paste. It is commonly known that the metal powder of a conductor paste is not sintered until the organic binder of the paste is decomposed and dissipated, and is sintered later than the metal powder alone, i.e., the occurrence of sintering and accompanying shrinkage is shifted to a higher temperature region. Moreover, the sintering of the conductor metal occurs abruptly when the organic binder is decomposed and dissipated at a temperature of from 700° to 900° C., and this sintering behavior is quite different from that of the substrate ceramic. The above-recited publications delay the sintering shrinkage of the conductor metal, i.e., shift the occurrence thereof to a higher temperature so that it occurs at the same time as that of the substrate ceramic because the added organic metal is decomposed to form a metal oxide during the preliminary low temperature firing (or the removal of binder) and the subsequent high temperature firing, and the thus-formed metal oxide impedes the sintering of the conductor metal powder in a high temperature region of from 700° to 900° C. Thus, the shrinkage of a conductor paste occurring in a high temperature region of from 700° to 900° C. is controlled by the addition of an organic metal thereto.

Japanese Unexamined Patent Publication (Kokai) No. 61-89839 and Japanese Patent Application No. 2-9018 (by the same assignee as the present application) proposed a process utilizing the same principle, in which a metal oxide, instead of an organic metal, is directly added to a conductor paste.

Japanese Unexamined Patent Publication (Kokai) Nos. 2-18991, 1-281795 and 61-101096 proposed another process in which a conductor metal powder directly fills the throughholes instead of a conductor paste, to avoid an organic substance remaining in the via-contacts and also to improve the packing of the throughholes. Because these processes do not use an organic binder, the dissipation of an organic binder does not occur in the drying and firing steps, the formed via-contacts do not contain pores, and via-contacts of a sufficient packing density can be relatively easily formed in a porous green sheet.

In spite of these improvements, recent refinements in the circuit pattern requires a minute via-contact to have a diameter of about 100 μm and raised the following new problems.

When a conductor paste is used, a complete packing of a 100 μm throughhole is so difficult that neither the addition of an organic metal nor the direct addition of a metal oxide improves the packing density in the throughholes and the pores that occurred during the filling of throughholes remain substantially unchanged in the fired via-contacts. Moreover, because generally having a high thermal decomposition (thermal deterioration) temperature, organic metals often remain in the form of an incomplete chemical compound after the binder removal step or preliminary firing. Particularly, when a conductor metal is composed of an easily oxidizable metal such as copper, a heating must be carried out in a reducing atmosphere unfavorable for removing a binder and the binder remains even after the final firing is completed.

When a conductor metal powder directly fills the throughholes, a refined powder particle is advantageously used to provide a complete packing of minute throughholes. The use of a metal powder alone, however, has a problem in that shrinkage occurs at a temperature lower than that of a substrate ceramic and still lower than that of a conductor paste during the binder removal and the firing, thereby frequently causing a gap between the thus-formed via-contacts and the ceramic substrate because of the different shrinkage factors thereof. Particularly, when the conductor is composed of copper, the heating for removing a binder is carried out in a humidified nitrogen gas atmosphere to prevent oxidization of the copper, and under this atmosphere, the shrinkage of a copper powder begins at a temperature of from 300° to 400° C., which is still lower than that which occurs in a dry nitrogen gas atmosphere. This causes the formation of a gap between the via-contact and the substrate ceramic in a low temperature region of from 400° to 500° C. and the thus-formed gap is larger than that formed when via-contacts are formed with a conductor paste.

To solve this problem, the present inventors have proposed a process in Japanese Patent Application No. 2-9018, in which a conductor metal powder blended with a ceramic powder fills the throughholes. This process effectively prevents the formation of pores at the via-contact/substrate ceramic interface by suppressing the occurrence of shrinkage in a low temperature region of 700° C, or lower, particularly 400° to 700° C., which disadvantageously occurs when a copper powder alone fills the throughholes. This process, however, has a disadvantage in that via-contacts are embrittled and weakened because of the unstable bond between the fired metal particles when a ceramic powder is added in an excessive amount or a ceramic powder has an excessively large particle size.

To solve the problem that a good adhesion cannot be obtained when a conductor particle directly fills the throughholes because of poor wettability thereof with a ceramic, the above-recited Japanese Unexamined Patent Publication (Kokai) No. 2-18991 proposed the addition of chromium oxide to the metal powder. This process, however, has a problem in that the corrosion of the via-contact easily occurs during the firing step and the toxicity of chromium oxide results in low operation efficiency.

It is also noted that the above-recited Japanese Unexamined Patent Publication (Kokai) No. 2-18991 describes the particle size of the copper powder and the chromium oxide ($Cr_2O_3$) powder as one tenth (1/10) the throughhole diameter or less, particularly from about one tenth (1/10) to about five-hundredth (1/500).

SUMMARY OF THE INVENTION

The object of the present invention is to solve the above-mentioned problems and provide an improved process of producing a multiple-layer glass-ceramic circuit board having a circuit conductor of copper, in which a sound minute via-contact having a diameter of about 100 μm can be formed by a complete filling or packing of the throughholes.

To achieve the object according to the present invention, there is provided a process of producing a multiple-layer glass-ceramic circuit board having a copper conductor, comprising the steps of:

forming throughholes in a glass-ceramic green sheet at sites where via-contacts will be formed;

filling the throughholes with a powder mixture of a copper powder blended with a ceramic powder, the copper powder and the ceramic powder having a powder particle size providing a packing density comparable with or greater than that of the glass-ceramic green sheet when filled in the throughholes;

printing a conductor paste on the green sheet having the throughholes filled with the powder mixture to form a circuit conductor pattern on the green sheet;

laminating a plurality of the green sheets having the conductor pattern formed thereon to form a laminate body;

heating the laminate body to thereby remove a binder therefrom and preliminary-fire the laminate body; and
firing the preliminary-fired body.

As herein already described, the undesired formation of pores in a via-contact is caused by the following factors:

[Factor 1] When a conductor paste is used to compose a via-contact, the throughholes of a green sheet are not completely filled with a copper powder, and therefore, the throughholes are not uniformly packed or filled with the powder and/or a void is retained in the throughholes.

[Factor 2] A copper powder and a green sheet have different sintering or shrinking temperatures.

The present invention eliminates these factors as follows:

Factor 1 is eliminated in the conventional manner, i.e., by filling or packing a conductor powder, instead of a conductor paste, in the throughholes to ensure a complete filling or packing thereof.

Regarding Factor 2, the present inventors found that the difference between the shrinkage factors or sintering temperatures of a copper powder and the ceramic of a green sheet can be eliminated by filling the throughholes with a powder mixture of a copper powder blended with a ceramic powder; the copper and ceramic powders having a particle size providing a packing density comparable with or greater than that of the glass-ceramic green sheet when filled or packed in the throughholes.

DESCRIPTION OF THE PREFERRED EMBODIMENTS

Figure 1:
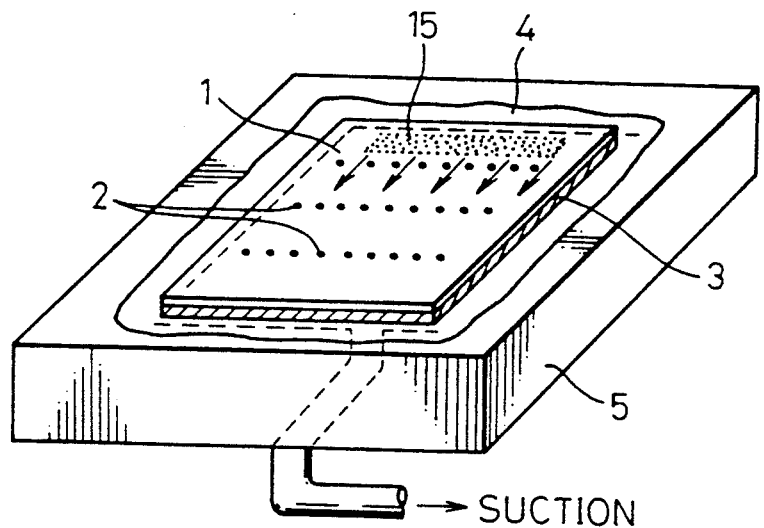
FIG. 1 is a perspective view showing an arrangement for filling a via-contact forming substance in throughholes of a glass-ceramic green sheet.

A glass-ceramic green sheet usually used has a relative density of from about 50 to about 60% in the unfired condition and the corresponding powder mixture according to the present invention has particle sizes of the component copper and ceramic powders such that the powder mixture is filled in a throughhole at a packing density of from about 55 to about 65% in the unfired condition. This minimizes the difference between the shrinkage factors of materials inside and outside a via-contact.

To obtain a packing density according to the present invention, a powder mixture is preferably prepared by blending a copper powder having an average particle size of from 0.3 to 8 $\mu$m with a ceramic powder having an average particle size of from 0.1 to 1 $\mu$m. A desired packing density of the present invention is more advantageously ensured when a ceramic powder has a particle size smaller than that of a copper powder to facilitate the inclusion of the copper particles between the ceramic particles.

Preferably, a green sheet has a shrinkage beginning temperature of from about 700° to about 1000° C., and in accordance therewith, a powder mixture is prepared by blending a copper powder with a ceramic powder, both having an adjusted particle size in an adjusted proportion so that the powder mixture exhibits a sintering behavior or has a shrinkage beginning temperature corresponding to that of the green sheet.

When a green sheet having a shrinkage beginning temperature within the above-mentioned range is used, a copper powder is suitably blended with a powder of alumina, silica, mullite or other ceramic which does not react with copper at a high temperature up to about 1000° C. A powder of these ceramics should be blended with a copper powder in a proportion such that the shrinkage of copper occurring at about 600° C. is particularly suppressed and the shrinkage of copper is terminated at 1000° C. From this point of view, when a ceramic powder has an average particle size of from 0.1 to 1 $\mu$m, the content of a ceramic powder with respect to the total amount of a powder mixture is usually from about 0.5 to about 10 vol %, and preferably from about 0.5 to about 5 vol %. A ceramic powder content of less than 0.5 vol % does not effectively fit the sintering shrinkage time of a conductor metal to that of a glass-ceramic. A ceramic powder content of more than 10 vol % increases the electric resistivity of a conductor metal.

The present invention will be described in further detail by way of typical experimental results.

The sintering behaviors of the present inventive powder mixture and glass-ceramic board are studied by carrying out an experiment using model samples.

Model samples of a powder mixture were prepared by blending a copper powder having an average particle size of 1 $\mu$m with an alumina powder having an average particle size of 0.3 $\mu$m in different alumina proportions of 3, 5 and 10 vol %. The mixtures were milled in a ball mill for 24 hours and pressed to form a 5 by 55 by 3 mm powder compact. Another powder compact of a copper powder alone was prepared for comparison.

A model sample of a glass-ceramic board was prepared by mixing and milling powders having the following composition and pressing the resultant mixture to a powder compact consisting of an alumina-based glass-ceramic.

Figure 2:
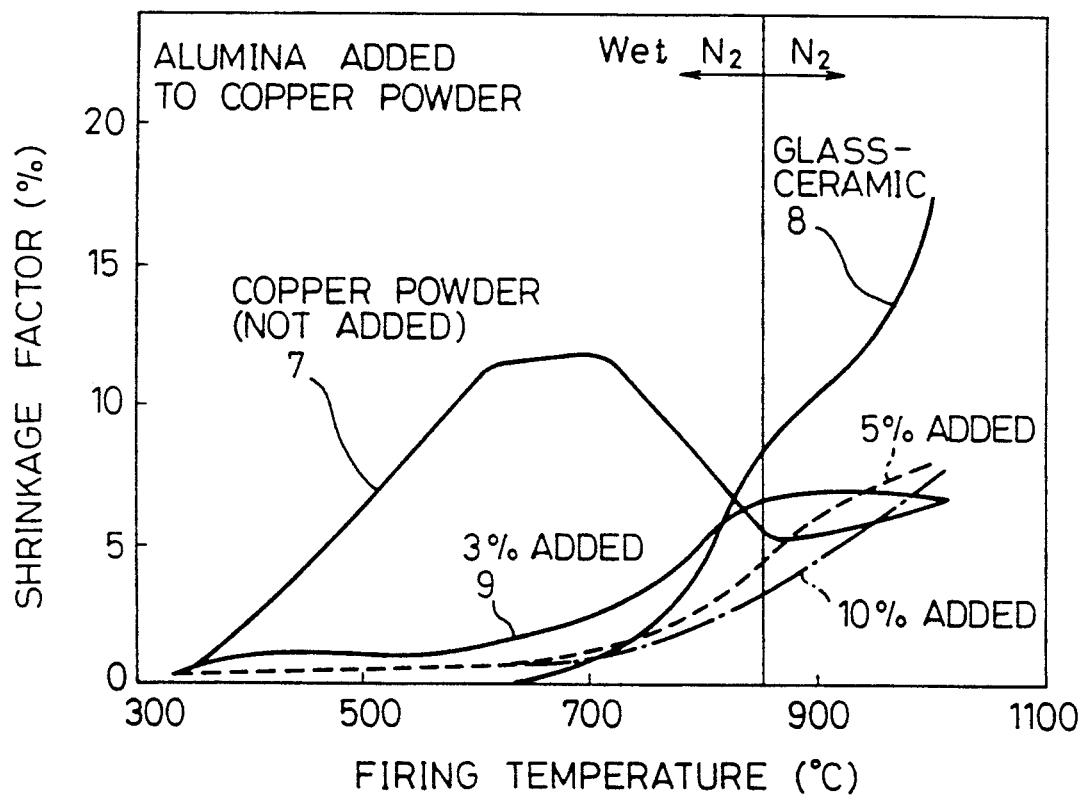
FIG. 2 is a graph showing the sintering shrinkage behavior of a powder compact of a mixture of copper and alumina powders in comparison with those of a copper powder alone and a glass-ceramic.

Ceramic powder: alumina powder . . . 50 part by weight
Glass powder: borosilicate glass powder . . . 50 part by weight The samples were fired in a moistened nitrogen ($N_2$) gas atmosphere at various firing temperatures and the shrinkage factors were determined. FIG. 2 shows the relationship between the firing temperature and the shrinkage factor.

It can be seen from FIG. 2 that the shrinkage factor of the powder compact of copper alone (curve 7) is increased with the increase of the firing temperature up to about 600° C. and is decreased with a further increase of the firing temperature above about 700° C., whereas the shrinkage factor of the powder compact of glass-ceramic (curve 8) is simply increased with the increase of the firing temperature, exhibiting a particular remarkable shrinkage when the firing temperature is above about 700° C. This difference in the shrinking behavior causes the occurrence of a pore in a via-contact.

Figure 3:
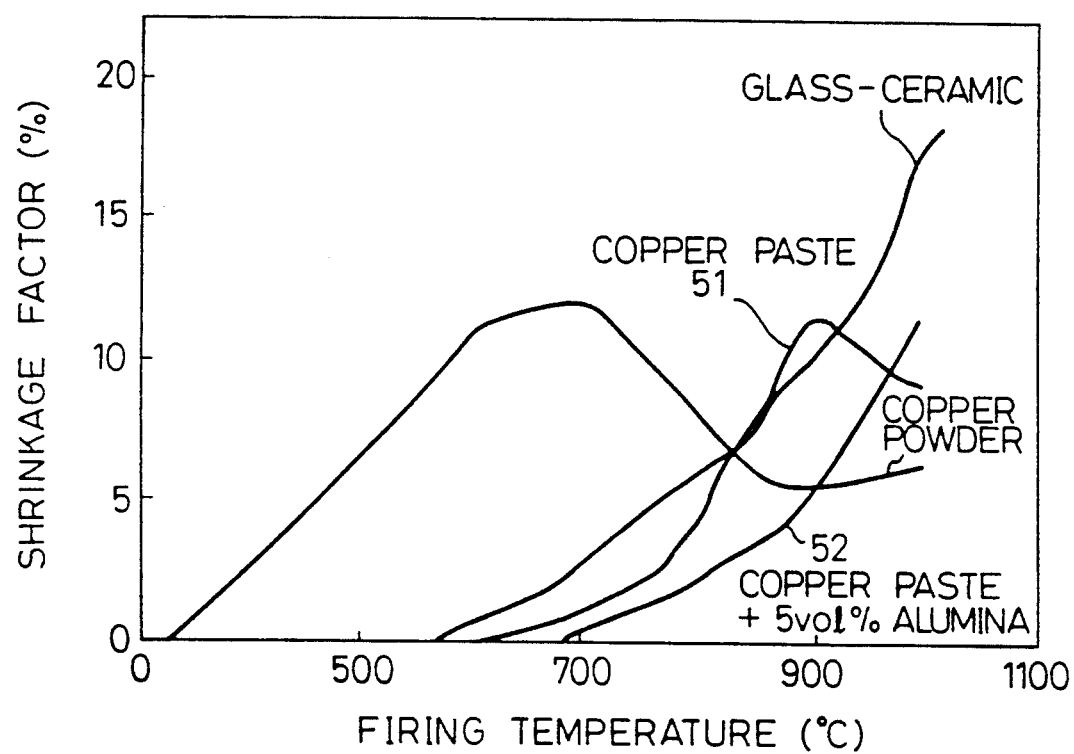
FIG. 3 is a graph showing the sintering shrinkage behavior of a copper paste in comparison with those of a copper powder alone and a glass-ceramic.

In comparison with these results, FIG. 3 shows the shrinkage factors of a conventionally used copper paste (typical composition: 100 part by weight of copper powder, 2 part by weight of PMMA, 1 part by weight of plasticizer, and 20 part by weight of solvent) and the same copper pabte blended with 5 vol % of an alumina powder, as a function of the firing temperature. The copper paste alone (curve 51) does not shrink at firing temperatures up to about 600° C. and abruptly shrinks when the firing temperature is above about 700° C. and close to about 800° C., and the shrinkage factor is decreased when the firing temperature is higher than about 900° C.: the shrinkage factor is different from that of a glass-ceramic particularly at firing temperatures above about 800° C. and this difference causes the formation of pores in a via-contact. The addition of an alumina powder to the copper paste (curve 52) suppresses both the abrupt shrinkage at about 800° C. and the decrease in shrinkage above about 900° C., and thereby, the shrinkage behavior becomes similar to that of the grass-ceramic.

A powder compact prepared by adding 3 vol % of alumina powder to a copper powder (curve 9 of FIG. 2) exhibits a shrinkage behavior very similar to that of a glass-ceramic (curve 8), such that the shrinkage factor of the former is increased with an increase of the firing temperature, and then, slightly decreased or substantially constant when the firing temperature is higher than about 800° C. due to excessive firing of the copper. It is also noted that the shrinkage factor is decreased as the amount of alumina added is increased factor due to an excessive firing of copper is also shifted to a higher temperature region.

Figure 4:
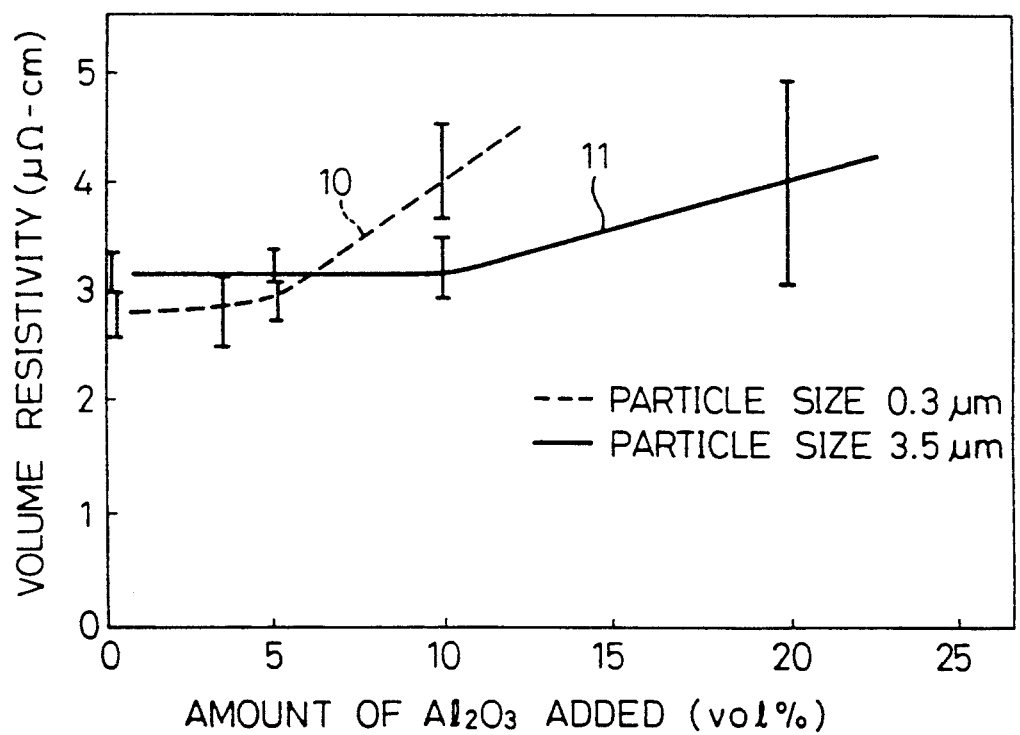
FIG. 4 is a graph showing the electrical resistivity of a fired compact of a mixture of copper and alumina powders as a function of the alumina content thereof, for two levels of alumina particle sizes.
Figure 5:
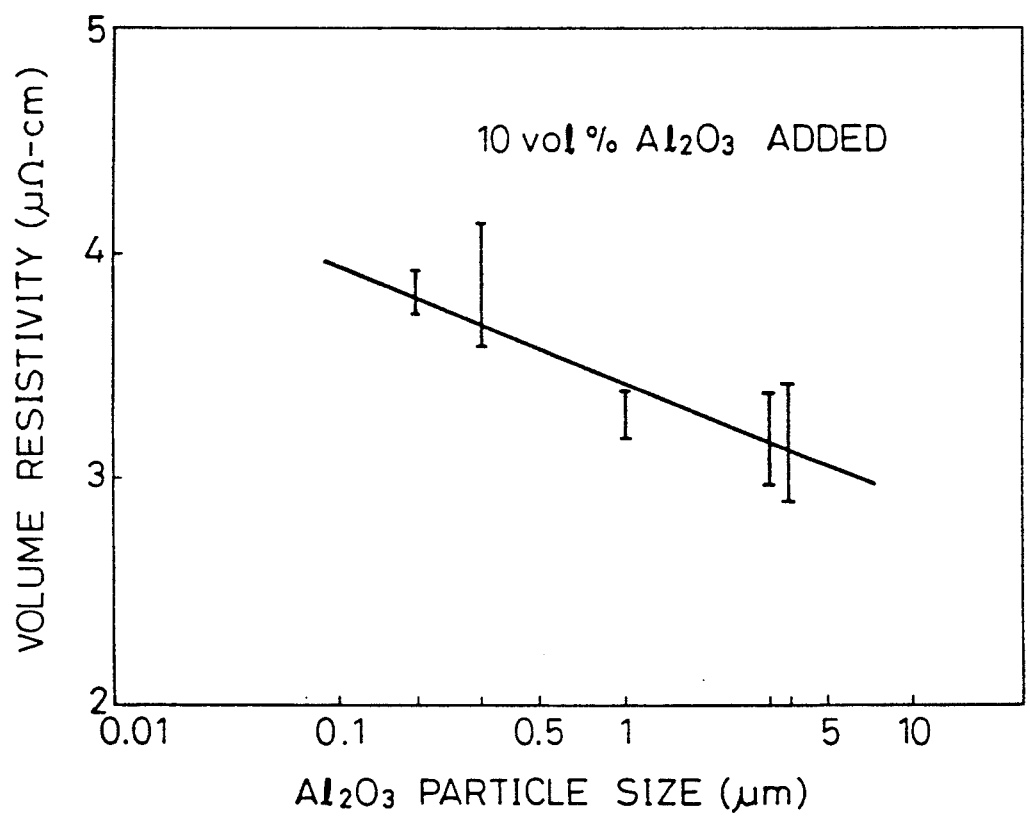
FIG. 5 is a graph showing the electrical resistivity of a fired compact of a mixture of copper and alumina powders as a function of the alumina particle size.

FIG. 4 shows the relationship between the amount of alumina added to a copper powder and the electrical resistivity, in which two alumina powders respectively having two levels of particles sizes of 0.3 and 3.5 μm were used for the addition. FIG. 5 shows the electrical resistivity as a function of the alumina particle size, when the amount of alumina added is fixed at 10 vol %.

It can be seen from FIG. 5 that the smaller the particle size of an alumina powder, the greater the electrical resistivity due to the greater specific surface area of the smaller particle. FIG. 4 shows that an increase in the electrical resistivity appears at a smaller amount of alumina added when the average alumina particle size is 0.3 μm than when 3.5 μm and that no substantial increase of the electrical resistivity occurs at the amount of alumina added of up to about 5 vol % when the alumina particle size is about 0.3 μm. When the average alumina particle size is 1.0 μm, the electrical resistivity is not increased when the amount of alumina added is up to about 10 vol %.

Thus, the addition of a suitable amount of alumina powder to a copper powder provides a sintering shrinkage factor close to that of a glass-ceramic and thereby prevents the formation of a pore caused by different shrinkage behaviors, while ensuring electrical resistivity substantially the same as that of a copper powder alone.

A mixture of copper and ceramic powders is filled in throughholes in the following manner.

Figure 6:
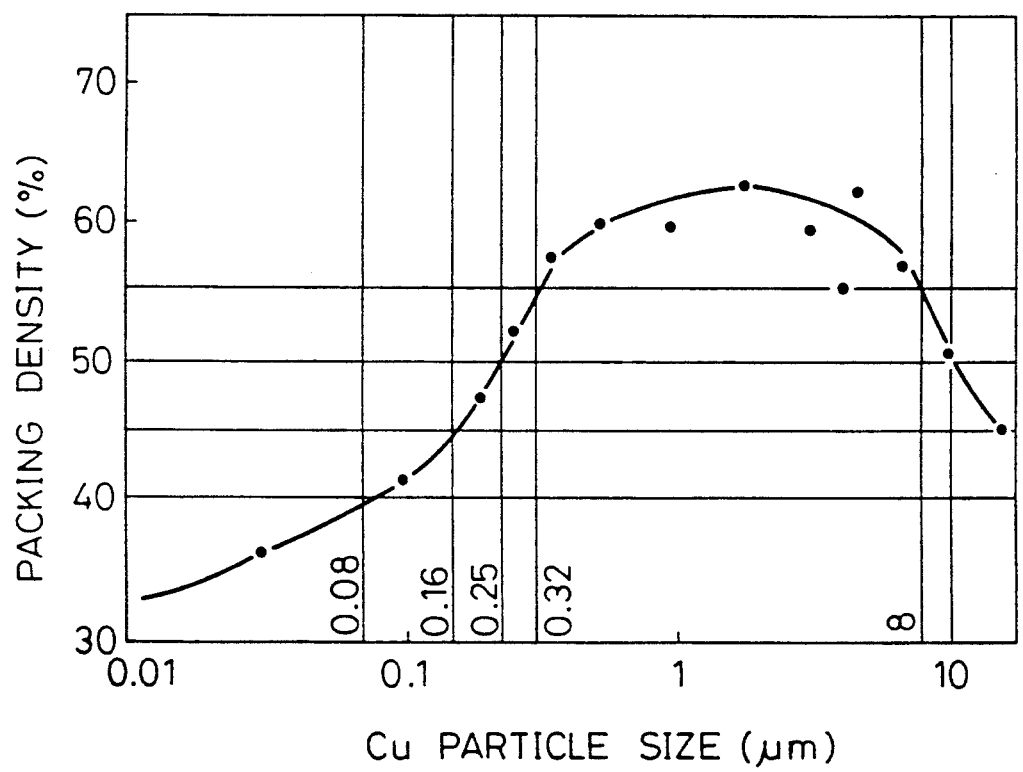
FIG. 6 is a graph showing the packing density of a copper powder filled alone in the throughholes of a glass-ceramic green sheet as a function of the average copper particle size.

FIG. 6 shows the packing densities obtained when copper powders alone having different average particle sizes were filled in 100 μm dia. throughholes formed in a glass-ceramic green sheet. The packing density is calculated from the weight and volume measured when a powder is filled in 100,000 throughholes of one green sheet.

The copper powder was filled in throughholes by using the same arrangement as shown in FIG. 1, in the following sequence.

A 350 by 350 mm green sheet 3 was placed on a filling table 5 and thoroughly covered with a Mylar sheet 1. About 100 g of a copper powder 15 having an average particle size of 1 μm was spread in the form of a belt on the Mylar sheet 1.

A hard rubber squeegee (not shown) was positioned at an angle of 30° to 45° to the green sheet 3, pressed against the Mylar sheet 1 at a pressure of 2 kg/cm$^2$, and moved on the Mylar sheet 1 at a speed of 30 cm/min to force the copper powder to flow and fall in and fill the throughholes 2 of the green sheet 3. The squeegee was moved twice on one green sheet to facilitate a complete filling of the powder.

The filling table 5 had 1 mm dia. suction holes at a pitch of 1 mm and a filter paper or suction paper 4 was interposed between the green sheet 3 and the filling table 5 to ensure a uniform suction through respective throughholes of the green sheet 3. The filling was carried out by using this arrangement while the suction was effected by a vacuum pump (not shown) evacuating at a degree of vacuum of 700 mmHg.

Important conditions for this filling process include the fluidity of a copper powder and the operation of a vacuum suction. When a copper powder has a fine average particle size or is blended with an inorganic oxide powder having a fine average particle size, it is necessary that a vacuum pump operate at a high degree of vacuum and the suction holes of the filling table 5 be provided at a fine pitch. For example, when a powder mixture of a copper powder having an average particle size of 0.5 μm and an alumina powder having an average particle size of 0.5 μm is used, a 100-mesh screen mask is applied on a filling or suction table 5 to reduce the substantial pitch of suction holes.

The copper powder filled in throughholes of a green sheet is united with the green sheet in a body through laminating and firing steps. To bring close the shrinkage factors of the materials inside and outside throughholes during the firing, it is generally preferable that the copper powder is filled in the throughholes at a packing density comparable with or slightly greater than the relative density of the green sheet. When a copper powder is filled at a lower packing density, even if the powder per se has the same shrinking behavior as that of a green sheet, the powder actually exhibits a greater shrinkage factor to cause a gap or pore between the fired via-contact and green sheet. When a copper powder is filled at a packing density as mentioned above, a sound via-contact not containing a pore is obtained by firing.

In the case of FIG. 6, the glass-ceramic green sheet used had a relative density of about 60% with respect to the density of a glass-ceramic composite. A packing density of not less than 55% (actually 55 to 65%) was obtained when the copper powder used had an average particle size of from 0.3 to 8 μm. This packing density is comparable with or slightly greater than the relative density of the green sheet and is sufficient for forming a complete via-contact not containing a pore. The packing density is insufficient when a copper powder has an average particle size smaller than 0.3 μm. For example, a packing density as low as from 40 to 45% is caused by an average particle size of from 0.08 to 0.15 μm. Such a small particle size provides a low bulk density such that a sufficient packing density cannot be obtained unless vibration, pressing or other additional procedure is carried out after throughholes are filled with the copper powder. on the other hand, when the average particle size is greater than 8 μm, it is very difficult to fill a throughhole as small as 100 μm. For example, an average particle size greater than 10 μm only provides a packing density as low as 40%.

Thus, a copper powder suitably has an average particle size of from 0.3 to 8 μm, to provide a sufficient packing of a throughhole having a diameter of about 100 μm.

A ceramic powder to be added to a copper powder also has a suitable particle size range as follows.

Figure 7:
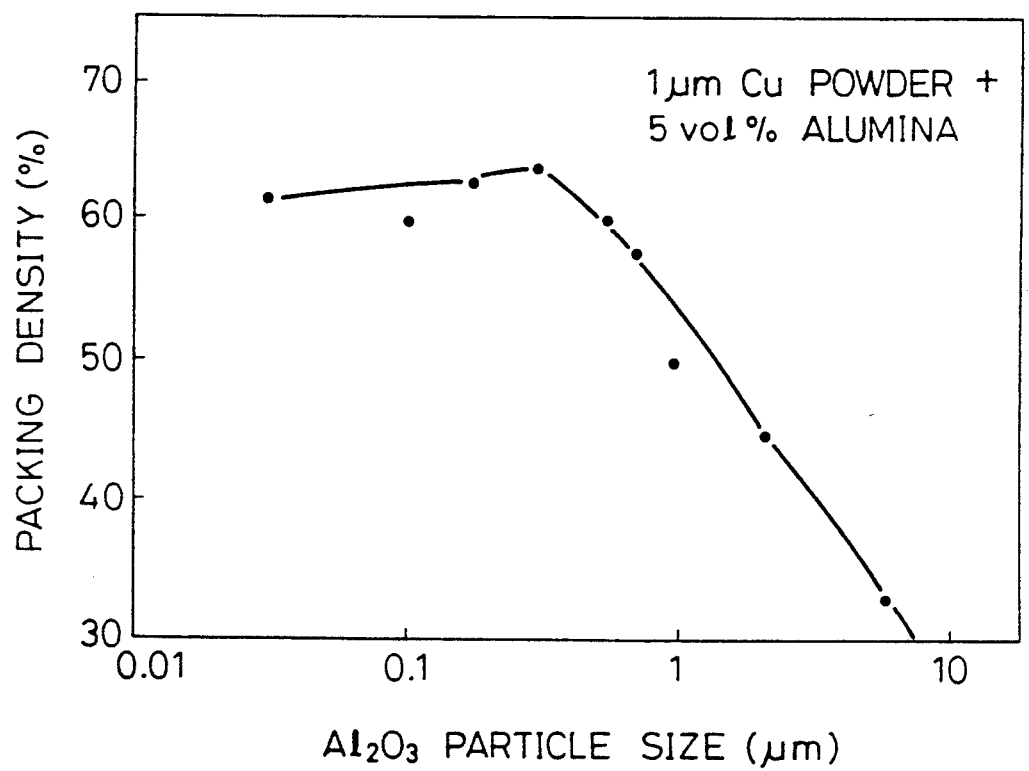
FIG. 7 is a graph showing the packing density of a mixture of copper and alumina powders filled in throughholes of a glass-ceramic green sheet, as a function of the average alumina particle size.

FIG. 7 shows a variation of the packing density obtained when a powder mixture prepared by blending a copper powder with an alumina powder is filled in a throughhole, as a function of the average particle size of the alumina powder. Fixed average copper particle size of 1 μm and amount of alumina blended of 5 vol % were used. The powder mixture was filled in throughholes of a glass-ceramic green sheet similar to that used in FIG. 4 and the packing density was calculated in the same way.

The results plotted in FIG. 7 show that when an alumina powder has an average particle size of 1 μm or less, a high packing density of 55% or more is obtained. When the average alumina particle size is greater than 1 μm, the packing density is decreased as the average particle size is increased. For example, an average alumina particle size of 2 μm or more only provides a packing density of 45% or less. This shows that an alumina powder suitably has an average particle size of 1 μm or less. An alumina powder, however, suitably has an average particle size of not less than 0.1 μm, because a smaller particle size makes it difficult for an alumina powder to be mixed with and dispersed in a copper powder.

Thus, an alumina powder to be added to a copper powder suitably has an average particle size of from 0.1 to 1 μm, to provide a sufficient packing of a throughhole having a diameter of about 100 μm.

According to the above-mentioned preferred embodiment of the present invention, a powder mixture is prepared by blending a copper powder having an average particle size of from 0.3 to 8 μm with a ceramic powder having an average particle size of from 0.1 to 1 μm in a suitable proportion, to provide a complete filling or packing of throughholes to an extent sufficient for obtaining, through firing, a sound via-contact not containing a pore.

The above-recited suitable particle sizes of the copper and ceramic powders were obtained in an experiment in which throughholes have a diameter of 100 μm. When throughholes have a smaller diameter, a similar experiment will provide suitable ranges of the average particle sizes of copper and alumina powders, respectively.

EXAMPLE 1

A multiple-layer glass-ceramic circuit board was produced according to the present invention by using a powder mixture prepared by blending a copper powder with an alumina ($Al_2O_3$) powder when forming via-contacts.

Green sheets were made in the following sequence.

A mixture having the following composition was prepared.

Ceramic powder: alumina powder . . . 30 parts by weight

Glass powder: borosilicate glass powder . . . 50 parts by weight

Binder: polymethyl methacrylate (PMMA) . . . 12 parts by weight

Plasticizer: dibutyl phthalate . . . 5 parts by weight

One part by weight of this mixture was mixed with three parts by weight of acetone and milled, and then, the acetone was evaporated to form a slurry, which was spread on a Mylar sheet by a doctor blade process to form a 300 μm thick green sheet.

The green sheet, together with the Mylar sheet, was drilled to form 100 μm dia. throughholes.

Meanwhile, a powder mixture was prepared by blending a copper powder having an average particle diameter of 1.0 μm with 5 vol % of an alumina powder having an average particle diameter of 0.3 μm and then mixed in a V-type mixer for 2 hours.

By using the arrangement shown in FIG. 1, the powder mixture was filled in the throughholes of the green sheet in the following sequence.

As can be seen in FIG. 1, the powder mixture or conductor powder 15 was heaped on one end of a resin film or Mylar sheet 1 in an amount sufficient for filling throughholes and a hard rubber squeegee (not shown), for example, was swept over the Mylar sheet 1 in the direction of the arrows to move the powder, so that the conductor powder 15 was filled in the throughholes 2.

To carry out the filling according to a preferred embodiment of the present invention, a sucking cavity (shown by a broken line) having an area comparable with that of the green sheet 3 is provided inside a filling table 5 and is connected with a vacuum pump (not shown) through a pipe appearing from the lower side of the filling table 5 (shown by a solid line connected with the broken line). A suction paper 4 is placed on the cavity to cover the latter. The green sheet 3 is entirely and uniformly sucked through the suction paper 4 during the filling of the conductor powder 15.

The suction paper 4 serves as a filtration paper to ensure a uniform suction of a conductor powder while preventing the component powders of the conductor powder 15 from being scattered.

After the throughholes 2 were filled with the conductor powder 15, the resin sheet or Mylar sheet 1 used as a mask was removed. Thereafter, a conductor paste was screen-printed on the green sheet 3 having throughholes filled with the conductor powder, to form a desired circuit conductor pattern on the green sheet 3.

60 pieces of green sheets corresponding to the respective layers of a multiple-layer circuit board were prepared in the same manner including the screen-printing of a conductor paste to form the respective electronic circuit patterns. After drying, the thus-prepared green sheets were aligned, laminated and pressed to form an integral laminate body.

The laminate body was heated in a humidified nitrogen gas atmosphere at 800° C. for 4 hours to effect a preliminary firing for removing a binder, and then, fired in a nitrogen gas atmosphere at 1000° C. for 4 hours to obtain a multiple-layer glass-ceramic circuit board.

A sectioned surface and a fractured surface of the multiple-layer glass-ceramic circuit board were observed with an optical microscope and a scanning electron microscope (SEM) and the results showed that a sound via-contact having no pores both at the substrate/via-contact interface and inside the via-contact was formed.

Although throughholes were formed by drilling in this Example, throughholes may be formed by pressing using a punch needle designed for opening a throughhole. In the latter case, a press provided with punch needles is travelled downward to perforate a green sheet 3 together with a Mylar sheet 1 overlaid thereon, to form a plurality of throughholes at once.

The thus-formed throughholes preferably have a diameter as fine as possible providing a fine circuit pattern, for example, a diameter of from 50 to 200 μm.

The green sheet usually has a thickness of about 100 to 500 μm.

The resin sheet to be overlaid on one side of the green sheet may be made of various materials, preferably of a polyethylene terephthalate resin having a good flatness and smoothness, and usually has a thickness of about 10 to 50 μm.

EXAMPLE 2

A multiple-layer glass-ceramic circuit board was produced according to the present invention by using a powder mixture prepared by blending a copper powder with a mullite ($3Al_2O_3 \cdot 2SiO_2$) powder when forming a via-contact.

Prior to the production of the multiple-layer circuit board, a suitable amount of mullite powder added to the copper powder was determined by the following preliminary experiment.

Preliminary Experiment

Figure 8:
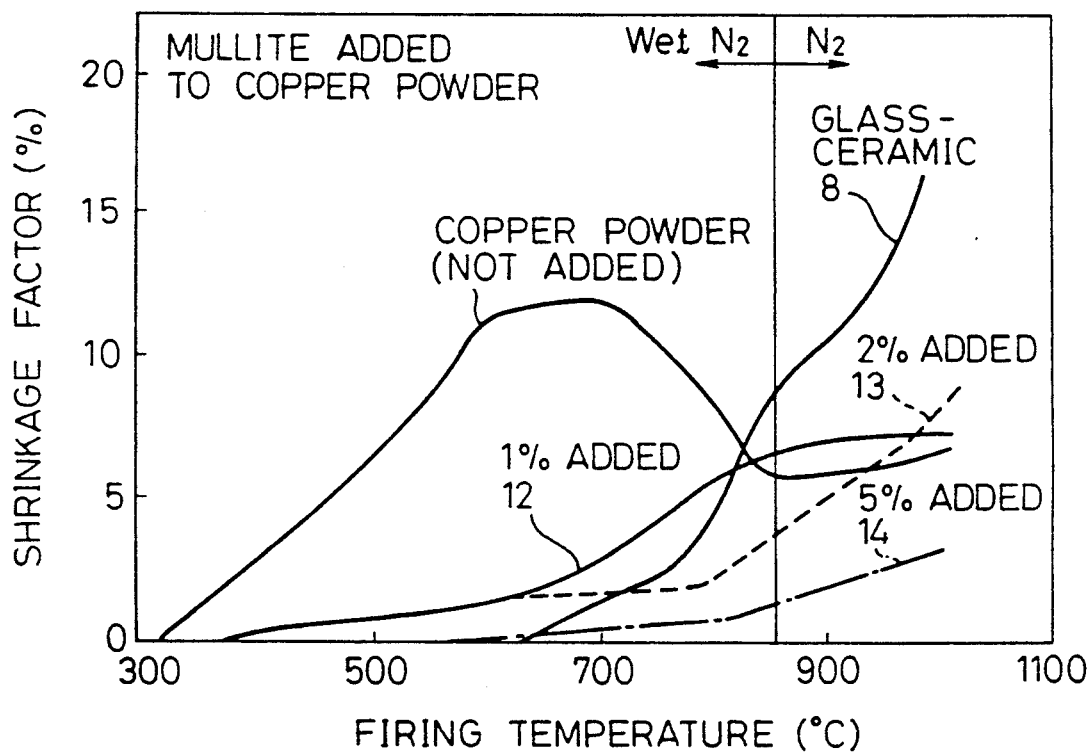
FIG. 8 is a graph showing the sintering shrinkage behavior of a powder compact of a mixture of copper and mullite powders in comparison with those of a copper powder alone and a glass-ceramic.

A copper powder having an average particle size of 2 μm was blended with a mullite powder having an average particle size of 0.3 μm in different amounts of 1, 2 and 5 vol % to form powder mixtures. 5 by 55 by 5 mm powder compacts prepared from these mixtures were fired at different temperatures and the shrinkage factors observed are shown in FIG. 8.

It can be seen from FIG. 8 that the influence of an excessive firing of copper was observed when the blended mullite amount is 1 vol % (curve 12), that a shrinking behavior similar to that of the substrate glass-ceramic (curve 8) was observed when the blended amount is 2 vol % (curve 13) and that the influence of an excessive firing of copper is observed at higher temperatures when the blended amount is 5 vol % (curve 14).

Accordingly, a suitable amount of mullite powder to be added to the copper powder was determined to be 2 vol %.

Production of Multiple-Layer Circuit Board

A powder mixture was prepared by blending a copper powder having an average particle diameter of 2 μm with a mullite powder having an average particle diameter of 0.3 μm in an amount of 2 vol % according to the above result.

The same sequence as used in Example 1 was performed to obtain a multiple-layer glass-ceramic circuit board.

A sectioned surface and a fractured surface of this multiple-layer glass-ceramic circuit board were observed with an optical microscope and a scanning electron microscope (SEM) and the results showed that a sound via-contact having no pores both at the substrate/via-contact interface and inside the via-contact was formed.

EXAMPLE 3

A multiple-layer glass-ceramic circuit board was produced according to the present invention by using a powder mixture prepared by blending a copper powder with a silica glass ($SiO_2$) powder when forming a via-contact.

Prior to the production of the multiple-layer circuit board, a suitable amount of silica glass powder added to the copper powder was determined by the following preliminary experiment.

Preliminary Experiment

Figure 9:
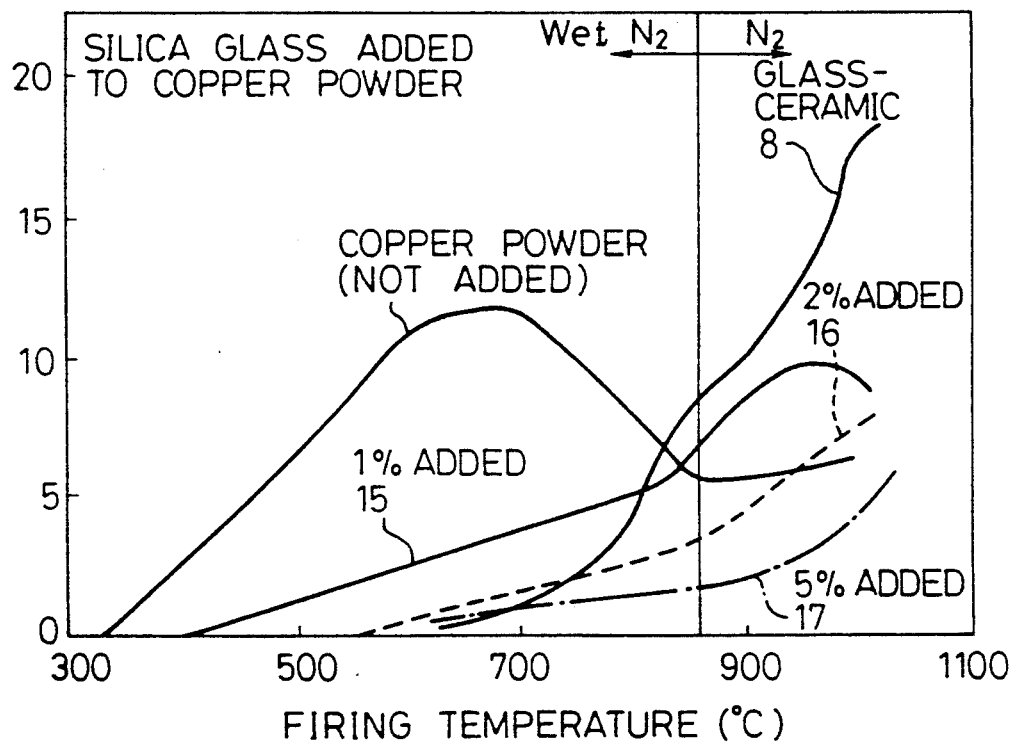
FIG. 9 is a graph showing the sintering shrinkage behavior of a powder compact of a mixture of copper and silica powders in comparison with those of a copper powder alone and a glass-ceramic.

A copper powder having an average particle size of 2 μm was blended with a silica glass powder having an average particle size of 0.3 μm in different amounts of 1, 2 and 5 vol % to form powder mixtures. 5 by 55 by 5 mm powder compacts prepared from these mixtures were fired at different temperatures and the shrinkage factors observed are shown in FIG. 9.

It can be seen from FIG. 9 that the influence of an excessive firing of copper was observed when the blended silica glass amount is 1 vol % (curve 15), that a shrinking behavior similar to that of the substrate glass-ceramic (curve 8) was observed when the blended silica amount is 2 vol % (curve 16) and that the influence of an excessive firing of copper is observed at higher temperatures when the blended amount is 5 vol % (curve 17).

Accordingly, a suitable amount of silica glass powder to be added to the copper powder was determined to be 2 vol %.

Production of Multiple-Layer Circuit Board

A powder mixture was prepared by blending a copper powder having an average particle diameter of 2 μm with a silica glass powder having an average particle diameter of 0.3 μm in an amount of 2 vol % according to the above result.

The same sequence as used in Example 1 was performed to obtain a multiple-layer glass-ceramic circuit board.

A sectioned surface and a fractured surface of this multiple-layer glass-ceramic circuit board were observed with an optical microscope and a scanning electron microscope (SEM) and the results showed that a sound via-contact having no pores both at the substrate/via-contact interface and inside the via-contact was formed.

Although a throughhole diameter of 100 μm was used in the herein described examples, a smaller throughhole diameter may be adopted by performing a preliminary experiment to determine suitable powder particle sizes and a blended amount for producing a multiple-layer glass-ceramic circuit board having a sound via-contact.

As described above, the present invention provides an improved process of producing a multiple-layer glass-ceramic circuit board having a circuit conductor of copper, in which a sound minute via-contact having a diameter of about 100 μm can be formed by a complete filling or packing of throughholes.

We claim:

1. A process of producing a multiple-layer glass-ceramic circuit board having a copper conductor, comprising the steps of:
    forming throughholes in a glass-ceramic green sheet at sites where via-contacts will be formed;
    filling said throughholes with a powder mixture of a copper powder blended with a ceramic powder, said copper powder and said ceramic powder having a powder particle size providing a packing density substantially equal to or greater than that of said glass-ceramic green sheet when filled in said throughholes;
    printing a conductor paste on said green sheet having said throughholes filled with said powder mixture, to form a circuit conductor pattern on said green sheet;
    laminating a plurality of said green sheets having said conductor pattern formed thereon, to form a laminate body;
    heating said laminate body thereby removing a binder from the laminate body while also preliminary-firing the laminate body.

2. A process according to claim 1, wherein said glass-ceramic green sheet has a relative density of from about 50 to about 60% and said copper powder and said ceramic powder have a powder particle size providing a packing density of from about 55 to about 65% when filled in said throughholes.

3. A process according to claim 1, wherein said copper powder has a powder particle size of from 0.3 to 8 μm and said ceramic powder has a powder particle size of from 0.1 to 1 μm.

4. A process according to claim 1, wherein said ceramic powder has a powder particle size smaller than that of said copper powder.

5. A process according to claim 1, wherein said green sheet begins to shrink at a temperature of from about 700° to about 1000° C. during said firing.

6. A process according to claim 1, wherein said ceramic powder is composed of a ceramic selected from the group consisting of alumina, silica and mullite.

7. A process according to claim 1, wherein said powder mixture is prepared by blending said copper powder with said ceramic powder in a proportion so as to suppress a large shrinkage which would otherwise occur at a temperature near 600° C. during a firing of said copper powder alone and complete a shrinkage at a temperature near 1000° C. during firing of said powder mixture.

* * * * *

UNITED STATES PATENT AND TRADEMARK OFFICE
CERTIFICATE OF CORRECTION

PATENT NO. : 5,287,620
DATED : February 22, 1994
INVENTOR(S) : Hitoshi Suzuki et al.

It is certified that error appears in the above-indentified patent and that said Letters Patent is hereby corrected as shown below:

Claim 7, Col. 14, line 30, delete "." after "C".

Claim 7, Col. 14, line 32, delete "." after "C".

Signed and Sealed this

Twelfth Day of July, 1994

Attest:

BRUCE LEHMAN

Attesting Officer        Commissioner of Patents and Trademarks